(12) United States Patent
Gorell et al.

(10) Patent No.: US 9,753,181 B2
(45) Date of Patent: Sep. 5, 2017

(54) SYSTEM AND METHOD FOR AUTOMATIC LOCAL GRID REFINEMENT IN RESERVOIR SIMULATION SYSTEMS

(75) Inventors: Sheldon Gorell, Katy, TX (US); Amit Kumar, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 423 days.

(21) Appl. No.: 14/389,685

(22) PCT Filed: Mar. 30, 2012

(86) PCT No.: PCT/US2012/031626
§ 371 (c)(1),
(2), (4) Date: Sep. 30, 2014

(87) PCT Pub. No.: WO2013/147875
PCT Pub. Date: Oct. 3, 2013

(65) Prior Publication Data
US 2015/0058262 A1 Feb. 26, 2015

(51) Int. Cl.
*G06F 15/18* (2006.01)
*G01V 99/00* (2009.01)
(Continued)

(52) U.S. Cl.
CPC .............. *G01V 99/005* (2013.01); *G01V 1/30* (2013.01); *G01V 1/302* (2013.01); *G01V 9/005* (2013.01);
(Continued)

(58) Field of Classification Search
USPC .......................................................... 706/2
See application file for complete search history.

(56) References Cited

U.S. PATENT DOCUMENTS 9,064,066 B2 * 6/2015 Kumar .................... G06F 19/00
9,262,563 B2 * 2/2016 Williams ............ G06F 17/5009
(Continued)

FOREIGN PATENT DOCUMENTS

WO WO-2012015515 A1 2/2012
WO WO2013/147875 10/2013

OTHER PUBLICATIONS

Electromagnetic-wave effects on closely packed microwave transistors using a fast time-domain simulation approach Y. A. Hussein; S. M. El-Ghazaly; S. M. Goodnick IEEE MTT-S International Microwave Symposium Digest, 2003 Year: 2003, vol. 2 pp. 989-992 vol. 2, DOI: 10.1109/MWSYM.2003.1212535 IEEE Conference Publications.*

(Continued)

*Primary Examiner* — Michael B Holmes

(57) ABSTRACT

A system and method of automatic local grid refinements in reservoir simulation systems is described. In one aspect of the disclosure, a method is directed to a computer-implemented method of modeling a formation. The method includes applying a coarse grid to a geologic formation of interest, the coarse grid having a plurality of coarse grid blocks and identifying a structure of interest disposed in the formation. Further, the method includes determining a fine grid zone around the structure based upon a time period for flow simulation of the geologic formation and a geologic characteristic of the geologic formation in a local region adjacent the structure and applying a fine grid to the coarse grid blocks encompassed by the fine grid zone.

16 Claims, 8 Drawing Sheets

(51) Int. Cl.
*G01V 1/30* (2006.01)
*G01V 9/00* (2006.01)
*G06F 17/50* (2006.01)
(52) U.S. Cl.
CPC ...... *G06F 17/5009* (2013.01); *G01V 2210/66* (2013.01)

(56) References Cited

U.S. PATENT DOCUMENTS

| | | | | |
|---|---|---|---|---|
| 9,285,500 | B2* | 3/2016 | Gorell | G01V 9/00 |
| 2008/0208539 | A1 | 8/2008 | Lee et al. | |
| 2009/0119082 | A1* | 5/2009 | Fitzpatrick | E21B 49/00 703/10 |
| 2010/0076738 | A1* | 3/2010 | Dean | E21B 43/26 703/7 |
| 2013/0231908 | A1* | 9/2013 | Williams | G06F 17/5009 703/2 |
| 2013/0231910 | A1* | 9/2013 | Kumar | G06F 19/00 703/10 |
| 2014/0136172 | A1* | 5/2014 | Gorell | G01V 9/00 703/10 |
| 2014/0157129 | A1* | 6/2014 | Dinshaw | G06F 3/017 715/728 |
| 2015/0058262 | A1* | 2/2015 | Gorell | G01V 1/30 706/2 |
| 2015/0081264 | A1* | 3/2015 | Kumar | G01V 1/30 703/10 |
| 2015/0293256 | A1* | 10/2015 | Dusterhoft | G01V 3/26 250/267 |
| 2016/0202390 | A1* | 7/2016 | Ramsay | E21B 43/00 703/6 |

OTHER PUBLICATIONS

Diving deep: data-management and visualization strategies for adaptive mesh refinement simulations M. L. Norman; J. Shalf; S. Levy; G. Daues Computing in Science & Engineering Year: 1999, vol. 1, Issue: 4 pp. 36-47, DOI: 10.1109/5992.774839 IEEE Journals & Magazines.*

Augmented Topological Descriptors of Pore Networks for Material Science Daniela Ushizima; Dmitriy Morozov; Gunther H. Weber; Andrea G. C. Bianchi; James A. Sethian; E. Wes Bethel IEEE Transactions on Visualization and Computer Graphics Year: 2012, vol. 18, Issue: 12 pp. 2041-2050, DOI: 10.1109/TVCG.2012.200 IEEE Journals & Magazines.*

Search Report and Written Opinion of the International Searching Authority; Jun. 20, 2012; 14 pages; U.S. International Searching Authority.

European Patent Office, Supplementary European Search Report, Dec. 19, 2016, 11 pages, Europe.

E.Ehrl and S.K. Schueler, Simulation of a Tight Gas Reservoir with Horizontal Multifractured Wells, SPE European Petroleum Conference, Oct. 24-25, 2000, 8 pages, Society of Petroleum Engineers Inc. SPE 65108, Paris, France.

* cited by examiner

SYSTEM AND METHOD FOR AUTOMATIC LOCAL GRID REFINEMENT IN RESERVOIR SIMULATION SYSTEMS

BACKGROUND

Reservoir simulation is an area of reservoir engineering that employs computer models to predict the transport of fluids, such as petroleum, water, and gas, within a reservoir. Reservoir simulators are used by petroleum producers in determining how best to develop new fields, as well as generate production forecasts on which investment decisions can be based in connection with developed fields.

Reservoir simulation software models are typically implemented using a number of discretized blocks, referred to interchangeably herein as "blocks," "grid blocks," or "cells." Models can vary in size from a few blocks to hundreds of millions of blocks. In these software simulations, it is common to model a reservoir using a grid formed of grid blocks and then simulate reservoir properties (e.g., pressure, temperature) within each grid block to predict flow. For example, such modeling is particularly useful in low permeability reservoirs for determining how many and where fractures should be induced in a reservoir to achieve a certain flow over a period of time.

In any event, the application of grid blocks in a reservoir simulation is very dependent on the type of reservoir being simulated. Typically, shale reservoirs have extremely low permeability when compared to other types of geologic reservoirs. For example, shale reservoirs may be less permeable than other geologic reservoirs by a factor of $10^{-6}$. As a result, flow in a portions of shale reservoir must be modeled at a very fine grid scale when compared to non-shale reservoirs, which may often be modeled with coarser grids, i.e., grid with larger grid blocks. Because fine grid scales are computationally undesirable over a large area, it is common in the industry to apply fine grids only to local areas of interest, such as around a fracture, and apply a coarser grid across the remainder of the reservoir. These fine grids around local areas of interest are referred to as local grid refinements ("LGRs") and are typically used to envelope the estimated region of the reservoir in which significant fluid and/or pressure movement will occur. Heretofore, for extremely low permeability reservoirs, there has never been a systematic process to determine the extent of this region of interest and where the boundary between LGRs and coarse grid blocks should exist. In other words, there is currently not a method in the prior art to a priori determine how far out from a fracture or other structure of interest to extent the fine grid blocks.

BRIEF DESCRIPTION OF THE DRAWINGS

A more complete understanding of the present disclosure and advantages thereof may be acquired by referring to the following description taken in conjunction with the accompanying figures, wherein.

DETAILED DESCRIPTION

To overcome the above-noted and other limitations of the current approaches, one or more embodiments described herein comprise a method of automatic local grid refinements in reservoir simulation models.

Figure 1:
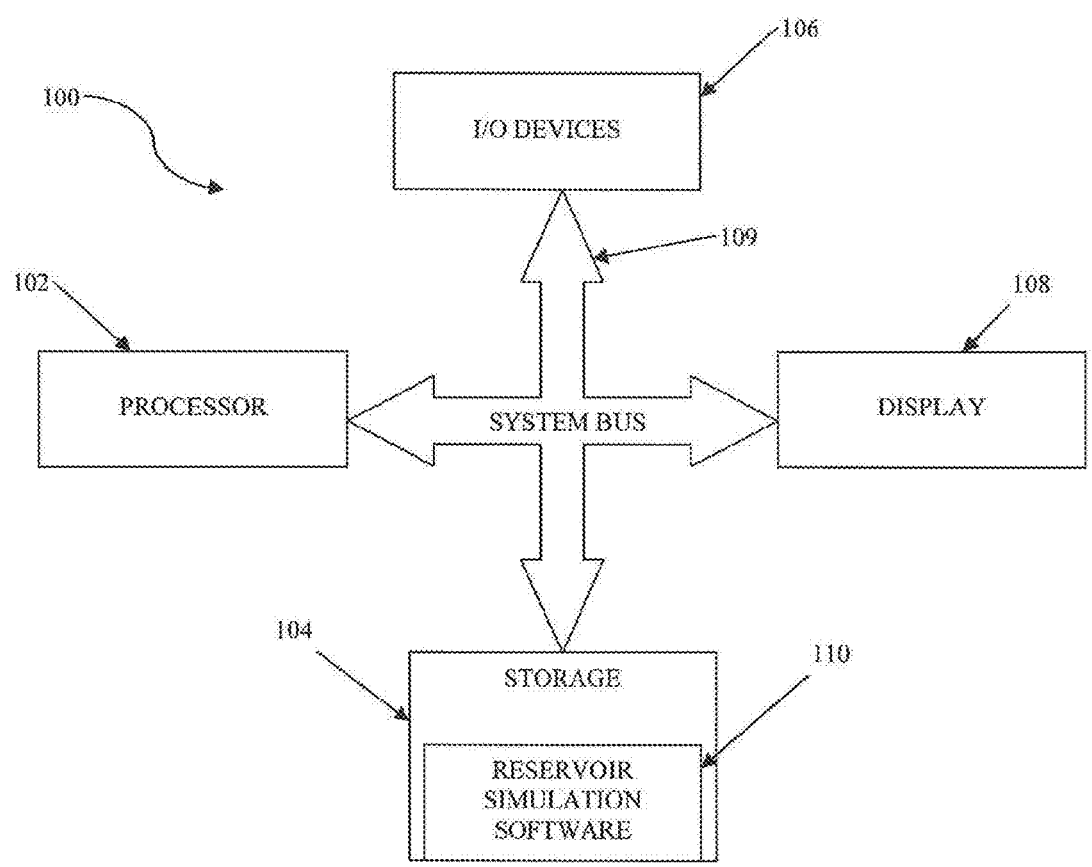
FIG. 1 is a block diagram of a computer system adapted for implementing a reservoir simulation system of exemplary embodiments.

FIG. 1 is a block diagram of an exemplary computer system 100 adapted for implementing the reservoir simulation system as described herein. In one embodiment, the computer system 100 includes at least one processor 102, a non-transitory, computer-readable storage 104, optional I/O devices 106, and an optional display 108, all interconnected via a system bus 109. Software instructions executable by the processor 102 for implementing a reservoir simulation system 110 in accordance with the embodiments described herein, may be stored in storage 104. Although not explicitly shown in FIG. 1, it will be recognized that the computer system 100 may be connected to one or more public and/or private networks via appropriate network connections. It will also be recognized that the software instructions comprising the reservoir simulation system 110 may be loaded into storage 104 from a CD-ROM or other appropriate storage media.

In one embodiment of the disclosure, a portion of the reservoir simulation system 110 is implemented using reservoir simulation software known in the art. Such reservoir simulation software typically utilizes numerical representations of the reservoir, either as it currently exists or as it is envisioned to exist at some point in the future once, such as before any wells are drilled and prior to any field development. This representation of the reservoir combined with additional data about proposed or existing wells and development strategy allows the software to predict how the reservoir might perform in terms of fluid injection and production. In the prior art, to the extent such reservoir simulation software defined local grid refinements ("LGRs") around areas of interest, it has not been done in an effective manner, but rather in a manner that results in computational inefficiency. For instance, the size of an LGR in the prior art has been defined based on simulation data. Further, an engineer may have had to manually define the LGR or LGR characteristics in the reservoir simulation software. In certain embodiments of the present invention, as described in more detail below, is a method for automatically applying an appropriately-sized LGR to an area of interest is provided. The method determines the distance from a geologic structure, such as a fracture, that a fine grid should extend so as to minimize the unnecessary application of fine grids in a reservoir simulation model. The method utilizes the reservoir parameters of porosity and permeability in conjunction with formation flow over a select period of time to automatically generate appropriately-sized and spaced LGRs for modeling flow over the time period. The reservoir simulation system 110 in the computer system 100 may implement this method and other methods contemplated by the embodiment.

Figure 2:
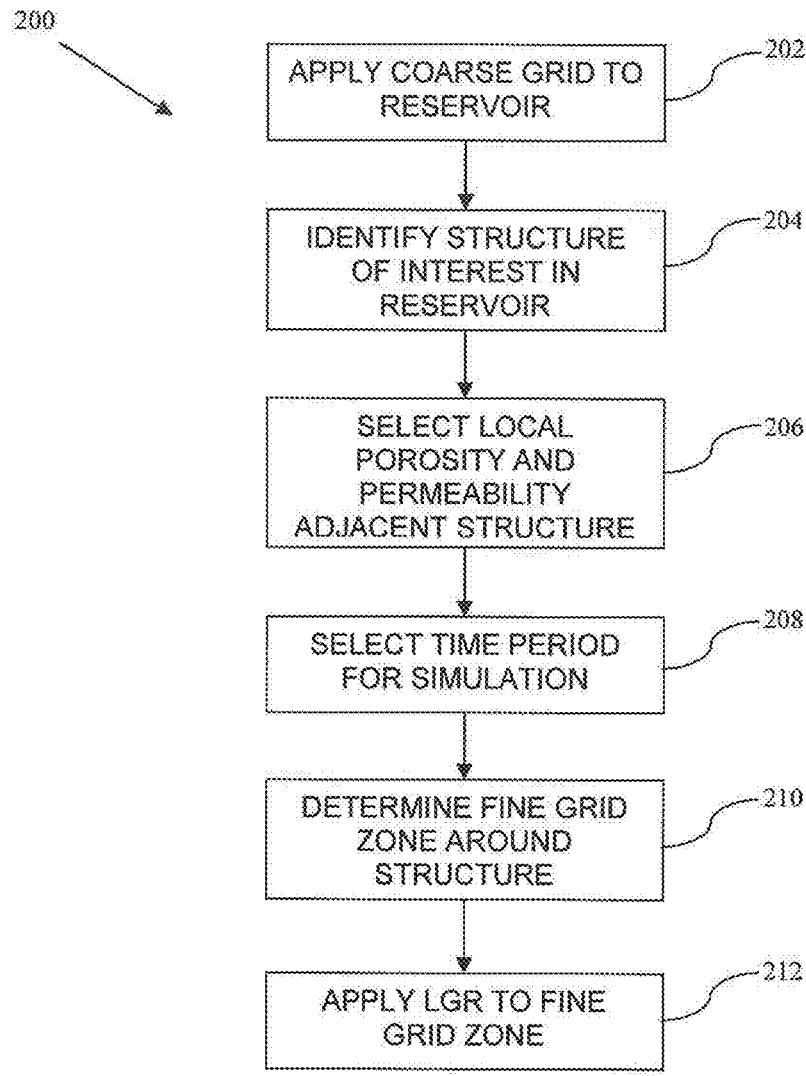
FIG. 2 is a flowchart illustrating a method implemented by the reservoir simulation system of FIG. 1 for performing embodiments described herein.
Figure 3:
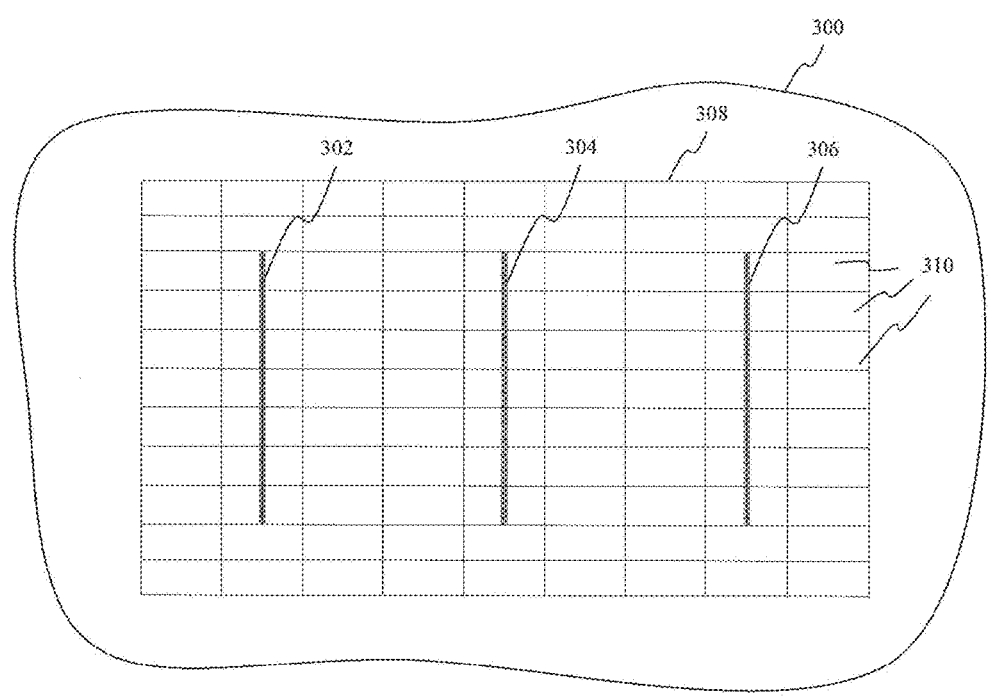
FIG. 3 illustrates a coarse grid applied to a reservoir that will be modeled by the reservoir simulation system of FIG. 1.

Turning to FIG. 2, a method 200 for utilization in the reservoir simulation system 110 to model a formation of interest is illustrated. In that regard, FIG. 3 illustrates a reservoir 300 that will be modeled by method 200. In the current embodiment, the reservoir 300 is an extremely low permeability shale reservoir, but in other embodiments, may be other types of formations. As shown in FIG. 3, the reservoir 300 includes one or more geologic features of interest, such as fractures, wellbores or the like. In FIG. 3, fractures 302, 304, and 306 are shown. A model of reservoir 300 should ultimately predict the areas of the reservoir in which fluid and/or pressure movement associated with the fractures will occur. For the purposes of the model created by system 110, these fractures may be either man-made or naturally occurring. In other embodiments, they may be other types of reservoir features that are of interest.

First, in step 202, a coarse grid 308 is applied to the reservoir 300. The coarse grid 308 is characterized by a multiplicity of coarse grid blocks 310. In certain embodiments, grid blocks 310 may be substantially uniform in shape and size, but the particular shape and size of grid blocks as described in the invention is not intended as a limitation. In any event, each of the coarse grid blocks 310 is used to discretely characterize a portion of the reservoir 300. As an aspect of this, reservoir engineering data may be collected on a grid block level. For example, each grid block 310 in the coarse grid 308 may be associated with a distinct porosity value and a distinct permeability value. A functional model of the reservoir 300 may be created by simulating reservoir properties such as pressure and temperature within each grid block.

Those skilled in the art will appreciate that while the coarse grid of this embodiment is described for convenience as cells or blocks of squares or rectangles existing in one plane, the embodiment is not limited to a grid defined in one plane. For example, all of the methods described herein are also valid in other dimensions, such as three dimensions ("3D"). Further, the grid blocks do not need to be of any particular shape. For convenience of description, the grid blocks are shown as rectangular. For purposes of the description, use of the terms "standard" grid block and "non-standard" grid block refers to the shape of the grid block of interest when compared to the common shape of a plurality of blocks in a grid. For example, a grid may be generally characterized by a plurality of rectangular grid blocks of a particular dimension w, h and l (where w, h and l are width, length and height respectively), thereby representing the "standard" shape of blocks for a grid.

Figure 4:
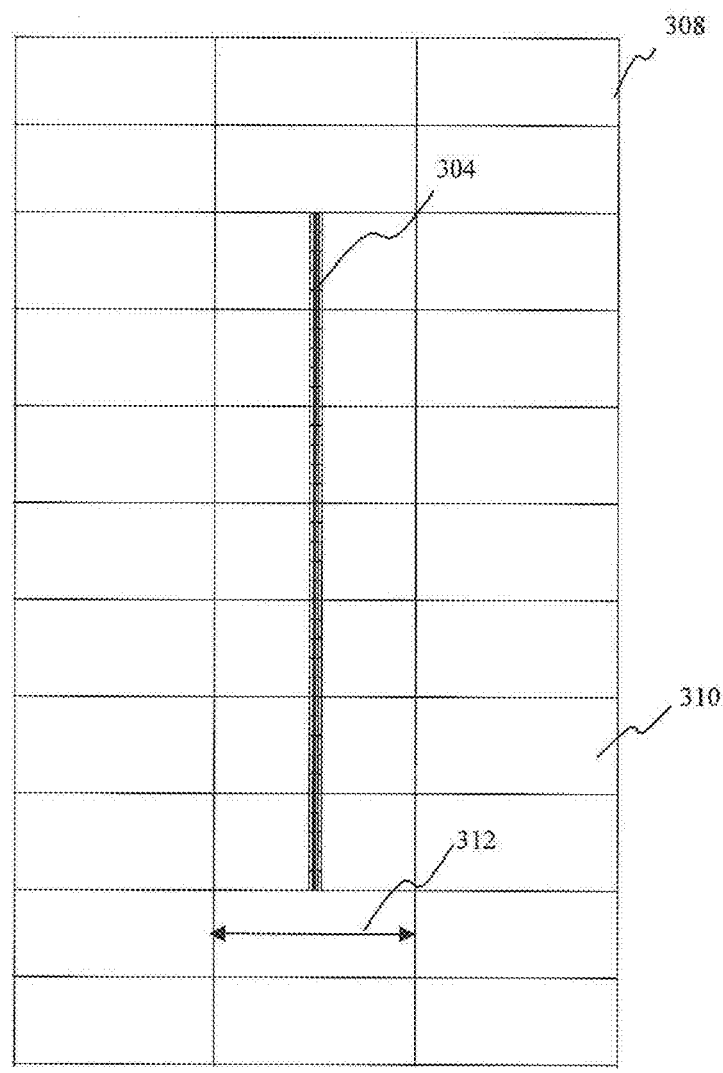
FIG. 4 illustrates a fracture disposed within the reservoir of FIG. 3.

Referring back to FIG. 2, at step 204, a structure of interest in the reservoir 300 is identified. The structure identified in step 204 may be an existing structure in an existing formation or it may be a proposed structure selected to achieve a particular flow in a modeled formation. In the illustrated embodiment, the identified structure is a fracture, for example fracture 304, as shown in more detail in FIG. 4. To accurately predict pressure flow in the regions surrounding the fracture 304, a model is used to simulate pressure flow at a large number of discrete locations around the fracture. As illustrated in FIG. 4, the coarse grid blocks 310 of coarse grid 308 may have a width 312 that is too large to produce an accurate simulation of the fracture's pressure change. Thus, an LGR is needed to replace the coarse grid blocks 310 in the areas surrounding the fracture 304. The application of an appropriately-sized LGR to fracture 304 is described in associated with the remaining steps of FIG. 2.

Those of ordinary skill in the art will appreciate that the foregoing need for use of an LGR in reservoir modeling is particularly prevalent in shale reservoirs, where extremely low permeabilities result in very slow fluid and pressure changes associated with fractures. Therefore the areas around the fractures require extremely fine grids to capture long pressure transient behavior.

Referring again to FIG. 2, at step 206, the porosity and permeability for the region surrounding the fracture 304 are selected. Porosity and permeability may be selected based on known data for the reservoir or expected or estimated data for the reservoir.

Figure 5:
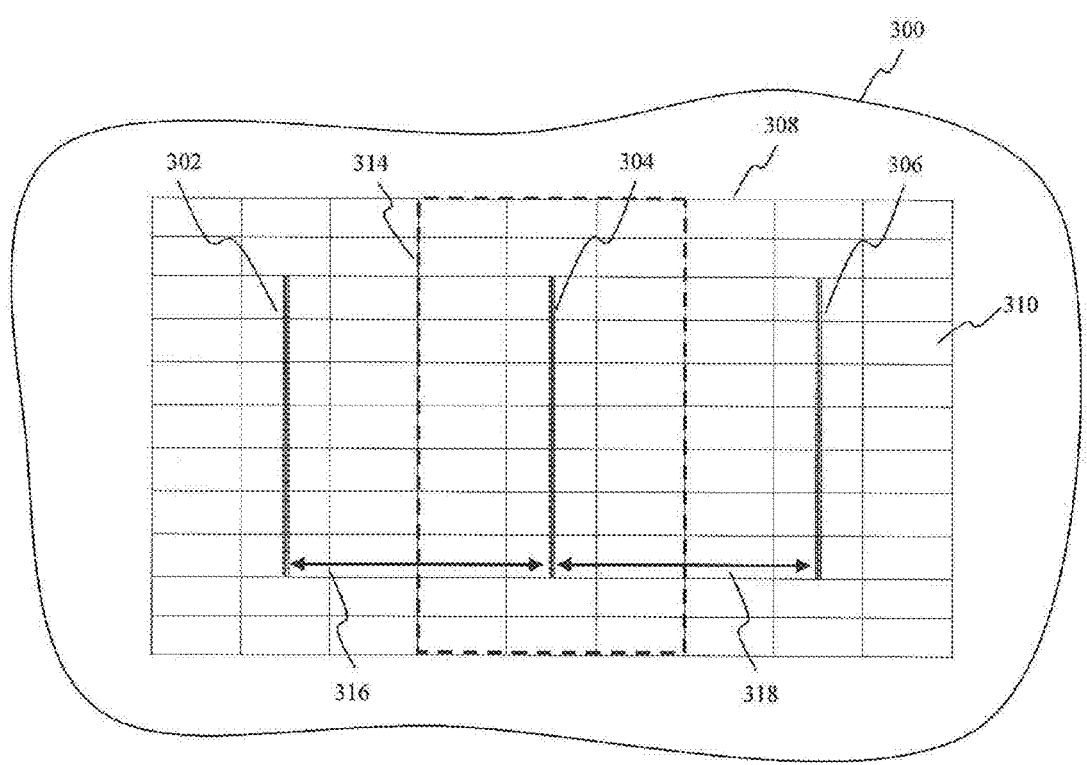
FIG. 5 illustrates an appropriately-sized local region surrounding the fracture of FIG. 4.

In certain embodiments, this step includes two sub-steps. First, the size of the local region around the fracture 304 in which average permeability and porosity is identified. Second, average values for permeability and porosity for the local region are determined. In FIG. 5, for example, a local region 314 around fracture 304 is shown. In certain embodiment, system 110 automatically determines the size the local region 314 based on the distances 316 and 318 between fracture 304 and the adjacent fractures 302 and 306 in reservoir 300. In the illustrated embodiment, the left-most outer boundary of local region 314 is approximately midway between the fracture 302 and fracture 304, and the right-most boundary is approximately mid-way between fracture 306 and fracture 304. For example, if the distance 316 is 500 feet, the local region 314 would extend approximately 250 feet away from fracture 304 in the direction of fracture 302. Further, the local region 314 may extend in the y-direction, and as applicable, the z-direction, away from fracture 304 depending on the distance to a reservoir boundary, another fracture, or some other structure. Those skilled in the art will appreciate that the local region surrounding a structure of interest in a reservoir may be determined in any number of various ways and the above determination is simply an example. For instance, in alternative embodiments, a local region may extend less than halfway between a fracture of interest and an adjacent fracture.

Next, after the local region 314 has been defined, the average permeability and average porosity for the local region are determined. As mentioned above, geologic engineering data collected by reservoir tools is associated with each grid block 310 in the coarse grid 308. That is, each grid block within the local region 314 has a discrete permeability value and a discrete porosity value. The average permeability values of the grid blocks within the local region 314 are determined to find overall permeability of the local region and the average porosity values of the grid blocks within the local region 314 are determined to find the overall porosity of the local region. In the illustrated embodiment, the permeability of the local region 314 is measured in millidarcies (mD) and the porosity is a value between 0 and 1 that represents a ratio of the pore volume over the total volume. In the event the boundaries of the local region 314 capture only partial grid blocks within the region, a grid block is considered to be within the region for the purposes of the permeability and porosity calculations if a greater percentage of it is inside the local region than outside the local region. Again, those skilled in the art will appreciate that the local permeability and porosity in the regions surrounding a fracture of interest in a reservoir may be determined in a variety of manners and the above manner is just one such example. The foregoing descriptions are intended only as one method for assigning porosity and permeability values to an area around a fracture. The invention is not limited to a particular method for this step so long as permeability and porosity values for the area around the structure are selected or otherwise assigned.

Referring back to FIG. 2, at step 208, a time period for the simulation of the movement of pressure in the reservoir 300 is selected. For example, it may be desirable to predict flow of a formation over a one year period, or perhaps over an extended period, such as 20 years. In some instances, the time period selected depends on the predicted number of years a reservoir will be producing oil and/or gas. In the present embodiment, a time period is selected in days, however, in other embodiment, different time units may be utilized.

Figure 6:
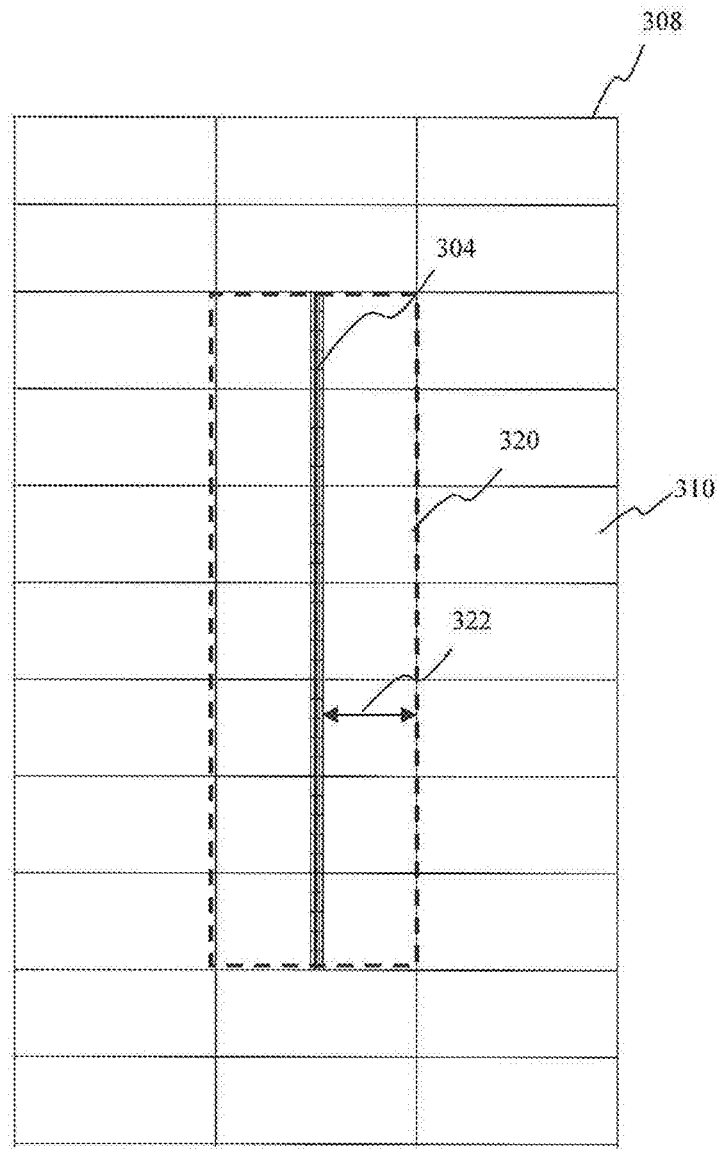
FIG. 6 illustrates a fine grid zone disposed around the fracture of FIG. 4.

Next, at step 210, the zone in which a fine grid will be applied to the fracture 304 is determined. Specifically, dimensions for the find grid are determined, i.e., how far away from the fracture 304 an LGR should extend, to allow for accurate yet efficient simulation computational performance. FIG. 6 illustrates a fine grid zone 320 around the fracture 304. In the illustration, fine grid zone 320 extends a distance 322 in the x-direction from fracture. In this step the local permeability and local porosity identified in step 206 and the simulation time period selected in step 208 are utilized to calculate distance 322. Notably, the local permeability and porosity values upon which the distance 322 is based are measured engineering data rather than variables estimated via a simulation. The distance 322 may be represented by the variable $X_{val}$ and is calculated in accordance with the following equation:

$$X_{val} = 10^a * \sqrt{\frac{time*k}{por}}$$

where time=the time period for the simulation of reservoir (in days);
k=permeability of the local region surrounding the fracture of interest (in mD);
por=porosity of the local region surrounding the fracture of interest (ratio from 0 to 1); and
a=an empirical constant determined through a series of calibration simulations run on the linear subsets of the reservoir of interest. The constant a depends at least on the temperature, pressure, and compressibility characteristics of a reservoir. Thus, two simulations of different reservoirs with similar permeability and porosity characteristics but run at different pressures, temperatures, and/or compressibility characteristics may utilize different a constants. In one embodiment, a is approximately 2.

After the distance $X_{val}$ 322 is calculated, it is applied to the coarse grid 308 to determine the number of coarse grid blocks 310 away from the fracture that will be encompassed by the fine grid zone 320. The calculated distance 322 may be applied in any direction from the structure. In the illustrated embodiment of FIG. 6, the calculated distance 322 is applied in the x direction from the fracture 304 so as to define the fine grid zone 320. In an alternate and complementary embodiment, the distance $X_{val}$ may also be applied in the y-direction and/or the z-direction. In certain preferred embodiment, when determining which grid blocks are included in the fine grid zone 320 and which are not, if a non-edge portion of a grid block is disposed at a $X_{val}$ distance away from the fracture, the entire grid block is included in the fine grid zone if the center point of the grid block is less than the distance $X_{val}$ away from the fracture. On the other hand, a grid block need not be included in the fine grid zone if its center point is greater than the distance $X_{val}$ away from the fracture. In alternative embodiment, however, at least one partial grid block may be included in the fine grid zone. In this manner, it is determined which grid blocks in the coarse grid 308 should be refined into smaller grid blocks so as to increase the accuracy of the reservoir simulation in the regions around a fracture.

Figure 7:
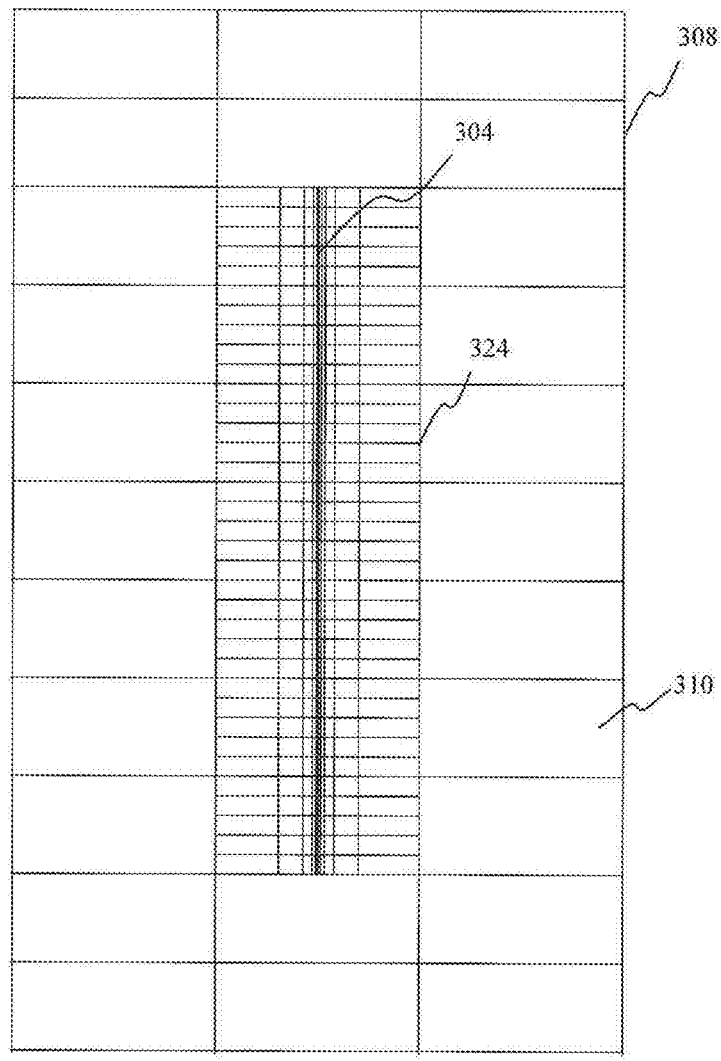
FIG. 7 illustrates the application of a local grid refinement to the coarse grid of FIG. 3 within the fine grid zone of FIG. 6.

Referring again to FIG. 2, at step 212, a local grid refinement is applied to the fine grid zone 320 determined in step 210. That is, each coarse grid block within the fine grid zone 320 is sub-divided into a plurality of smaller (i.e., finer) grid blocks. Thus, when the reservoir model is simulated, pressure and/or fluid movement is discretely calculated for each new fine grid block to achieve a more accurate simulation. The coarse grid blocks designated for refinement may be subdivided using any standard gridding algorithm known in the art. For example, a standard gridding algorithm may be applied to create an LGR around the fracture with uniformly-sized fine grid blocks. Or, in other embodiments, a geometric gridding algorithm may be utilized to create a LGR with fine grid blocks that geometrically increase in size as their distance away from the structure of interest increases. That is, in geometric LGRs, each grid block varies in size from an adjacent grid block in a direction by a constant factor. In alternative embodiments, any number of different and/or additional grid refinements may be applied to the fine grid zone. FIG. 7 illustrates the application of an LGR 324 to the coarse grid blocks within the fine grid zone. In the illustrated embodiment, the fine grid blocks of the LGR 324 geometrically increase in size the further away from the fracture 304 they are disposed (i.e., they are feathered). Thus, at the conclusion of step 212, a LGR envelope has been sized and applied to a fracture in a reservoir model based upon geologic engineering data such as permeability and porosity and also simulation duration.

Figure 8:
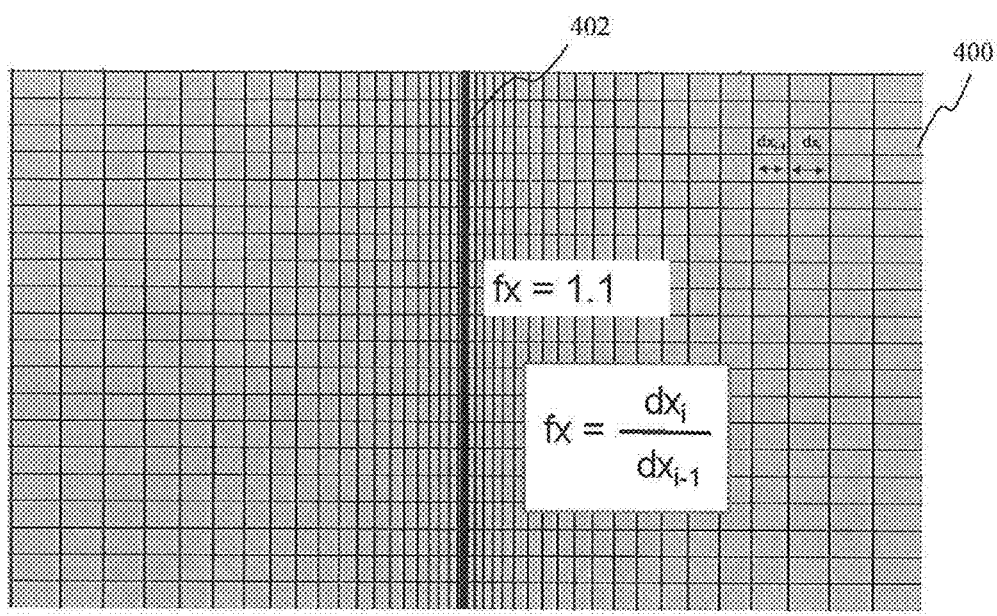
FIG. 8 illustrates an example embodiment of a geometric local grid refinement applied to a fracture in a reservoir.

FIG. 8 illustrates a more detailed example of a local grid refinement 400 as applied to a fracture 402. The LGR 400 includes geometrically-spaced fine grid blocks that vary in size from each other by a constant variable. Specifically, in the example of FIG. 8, the ratio (fx) of the size of any fine grid block ($dx_{i-1}$) to an adjacent grid block closer to the fracture 402 ($dx_i$) is 1.1. In other embodiments, however, the geometric factor may be in a range of about 1.05 to 1.3, or, may be a different value depending upon the characteristics of the reservoir. This geometric grid block arrangement increases the accuracy and computational efficiency of reservoir simulation because regions increasingly closer to a structure of interest are increasingly scrutinized. Thus, when a reservoir modeled with geometric LGRs is simulated, computing power is biased toward areas of the model in which more pressure movement is expected (i.e., regions near a fracture).

While the foregoing methods have been described with respect to a single structure of interest, it is understood that a formation may include many structures and that described fine grid zones around the various structure may overlap or intersect, such that a continuous fine grid may extend between adjacent structures.

The foregoing methods and systems described herein are particularly useful in drilling wellbores in oil and gas reservoirs. Following reservoir modeling as described herein, a drilling plan may be implemented based on the modeling. Persons of ordinary skill in the art will understand that the formation evaluated with the foregoing method may have hundreds of fractures or other structures that must be taken into consideration when determining the expected flow of a reservoir over a period of time. Thus, the plan includes preparing equipment to construct a wellbore, identifying one or more wellbores to be drilled in a formation and drilling of a wellbore into a reservoir based on desired or modeled flow. Specifically, the number, location and trajectory of wellbores in a formation relative to the fractures can be determined using the method of the invention in order to achieve a particular flow over a period of time. Those of ordinary skill in the art will appreciate that while the method of the invention has been described statically as part of implementation of a drilling plan, the method can also be implemented dynamically. Thus, a drilling plan may be implemented and data from the drilling process may be used to update the model. In particular, porosity and permeability can be determined during the process of drilling a wellbore. This real-time data may be used to adjust the wellbore being drilled or alter the number, location and trajectory of planned wellbores. After implementing the drilling plan, the system of the invention may be utilized during the drilling process on the fly or iteratively to calculate and re-calculate anticipated reservoir flow over a period of time as parameters change or are clarified or adjusted. In either case, the results of the dynamic calculations may be utilized to alter a previously implemented drilling plan.

In one exemplary aspect, the present disclosure is directed to a computer-implemented method of modeling a formation. The method includes applying a coarse grid to a geologic formation of interest, the coarse grid having a plurality of coarse grid blocks and identifying a structure of interest disposed in the formation. Further, the method includes determining a fine grid zone around the structure based upon a time period for flow simulation of the geologic formation and a geologic characteristic of the geologic formation in a local region adjacent the structure and applying a fine grid to the coarse grid blocks encompassed by the fine grid zone.

In another exemplary aspect, the present disclosure is directed to a computer-implemented reservoir simulation system. The system includes a processor, a non-transitory, computer-readable storage medium accessible by the processor, and software instructions stored on the storage medium. The instructions are executable by the processor for applying a coarse grid to a reservoir, the coarse grid having a plurality of coarse grid blocks identifying a fracture of interest disposed in the reservoir, determining an average geologic characteristic for a local region adjacent the fracture, and determining a fine grid zone around the fracture based upon a time period for flow simulation of the reservoir and the geologic characteristic. The determining includes calculating a distance $X_{val}$ away from the fracture at which the fine grid zone terminates based upon the time period for simulation and the geologic characteristic and defining the fine grid zone by the coarse grid blocks within the distance $X_{val}$ away from the structure in a direction. Further, the instructions are executable for applying a local grid refinement ("LGR") to the coarse grid blocks encompassed by the fine grid zone.

In yet another exemplary aspect, the present disclosure is directed to a computer-implemented reservoir simulation system. The system includes a processor, a non-transitory storage medium accessible by the processor, and software instructions stored on the storage medium. The instructions are executable by the processor for applying a coarse grid to a reservoir, the coarse grid having a plurality of coarse grid blocks and identifying a fracture of interest disposed in the reservoir. The instructions are also executable by the processor for determining a fine grid zone around the fracture based upon a time period for simulation of the reservoir, porosity of a region adjacent the fracture and permeability of the region adjacent the fracture and applying a fine grid to the coarse grid blocks encompassed by the fine grid zone.

In a further exemplary aspect, the present disclosure is directed to a method for drilling a wellbore in reservoir. The method includes applying a coarse grid to a geologic formation of interest, the coarse grid having a plurality of coarse grid blocks, identifying a structure of interest disposed in the formation, and determining a fine grid zone around the structure based upon a time period for flow simulation of the geologic formation and a geologic characteristic of the geologic formation in a local region adjacent the structure. The method also includes applying a fine grid to the coarse grid blocks encompassed by the fine grid zone to determine flow adjacent the structure, selecting a position and trajectory for a wellbore in the formation based on the determined flow. Further, the method includes preparing equipment to construct a portion of said wellbore and drilling a wellbore in accordance with the selected trajectory.

While certain features and embodiments of the disclosure have been described in detail herein, it will be readily understood that the disclosure encompasses all modifications and enhancements within the scope and spirit of the following claims. Furthermore, no limitations are intended in the details of construction or design herein shown, other than as described in the claims below. Moreover, those skilled in the art will appreciate that description of various components as being oriented vertically or horizontally are not intended as limitations, but are provided for the convenience of describing the disclosure.

It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee.

What is claimed is:

1. A computer-implemented method of modeling a formation, comprising:
    applying a coarse grid to a geologic formation of interest, the coarse grid having a plurality of coarse grid blocks;
    identifying a structure of interest disposed in the geologic formation;
    determining a fine grid zone around the structure based upon a time period for flow simulation of the geologic formation and an average permeability and an average porosity of the geologic formation in a local region adjacent the structure; and
    applying a fine grid to the coarse grid blocks encompassed by the fine grid zone,
    wherein determining the fine grid zone includes calculating a distance Xval away from the structure at which the fine grid zone terminates, the calculating based upon the time period for flow simulation and the average permeability and the average porosity of the geologic formation in the local region adjacent the structure, and
    wherein the calculating the distance $X_{val}$ is in accordance with the equation:

$$X_{val} = 10^a * \sqrt{\frac{time * k}{por}},$$

wherein time=the time period for simulation, k=average permeability for the local region adjacent the structure, por=average porosity of the local region adjacent the structure, and a=an empirical constant determined through calibration simulation of a linear subset of the geologic formation.

2. The computer-implemented method of claim 1, wherein the fine grid zone is defined by the coarse grid blocks within the distance $X_{val}$ in a direction away from the structure.

3. The computer-implemented method of claim 2, wherein the fine grid zone includes all coarse grid blocks having a center point that is less than the distance $X_{val}$ in the direction away from the structure.

4. The computer-implemented method of claim 1, wherein the fine grid zone is defined by the coarse grid blocks within the distance $X_{val}$ away from the structure in any direction.

5. The computer-implemented method of claim 1, further including defining the local region adjacent the structure based on the distance between the structure and adjacent structures in the formation.

6. The computer-implemented method of claim 5, wherein the local region is defined by coarse grid blocks within a distance approximately equal to halfway between the structure and an adjacent structure.

7. The computer-implemented method of claim 6, wherein the average permeability and the average porosity of the geologic formation in the local region adjacent the structure is defined as the average permeability and the average porosity of the coarse grid blocks encompassed by the local region.

8. The computer-implemented method of claim 1, where the structure is a fracture and the geologic formation is a reservoir.

9. The computer-implemented method of claim 8, wherein the geologic formation is an extremely low permeability shale gas reservoir.

10. The computer-implemented method of claim 1, wherein applying the fine grid includes applying a local grid refinement having geometrically spaced fine grid blocks to the coarse grid blocks encompassed by the fine grid zone.

11. A computer-implemented reservoir simulation system, the system comprising:
a processor;
a non-transitory, computer-readable storage medium accessible by the processor; and
software instructions stored on the storage medium and executable by the processor for:
applying a coarse grid to a reservoir, the coarse grid having a plurality of coarse grid blocks;
identifying a fracture of interest disposed in the reservoir;
determining an average permeability and an average porosity for a local region adjacent the fracture;
determining a fine grid zone around the fracture based upon a time period for flow simulation of the reservoir and the average permeability and the average porosity of the local region adjacent the fracture, the determining including:
calculating a distance $X_{val}$ away from the fracture at which the fine grid zone terminates based upon the time period for simulation and the average permeability and the average porosity of the local region adjacent the fracture; and
defining the fine grid zone by the coarse grid blocks within the distance $X_{val}$ in a direction away from the structure; and
applying a local grid refinement ("LGR") to the coarse grid blocks encompassed by the fine grid zone, wherein the calculating the distance $X_{val}$ is in accordance with the equation:

$$X_{val} = 10^a * \sqrt{\frac{time * k}{por}},$$

wherein time=the time period for flow simulation, k=average permeability for the local region adjacent the fracture, por=average porosity of the local region adjacent the fracture, and a=an empirical constant determined through calibration simulation of a linear subset of the reservoir.

12. The computer-implemented reservoir simulation system of claim 11, wherein determining the average permeability and the average porosity for the local region includes:
defining the local region by selecting coarse grid blocks within a distance approximately halfway between the fracture and an adjacent fracture; and
averaging the average permeability and the average porosity of each coarse grid block encompassed by the local region.

13. A computer-implemented reservoir simulation system, the system comprising:
a processor;
a non-transitory storage medium accessible by the processor; and
software instructions stored on the storage medium and executable by the processor for:
applying a coarse grid to a reservoir, the coarse grid having a plurality of coarse grid blocks;
identifying a fracture of interest disposed in the reservoir;
determining a fine grid zone around the fracture based upon a time period for simulation of the reservoir, porosity of a region adjacent the fracture and permeability of the region adjacent the fracture; and
applying a fine grid to the coarse grid blocks encompassed by the fine grid zone,
wherein determining the fine grid zone includes calculating a distance $X_{val}$ away from the fracture in accordance with the equation:

$$X_{val} = 10^a * \sqrt{\frac{time * k}{por}},$$

wherein time=the time period for simulation, k=average permeability for the region adjacent the fracture, por=average porosity of the region adjacent the fracture, and a=an empirical constant determined through calibration simulation of a linear subset of the reservoir.

14. The computer-implemented reservoir simulation system of claim 13, wherein the fine grid zone is defined by the coarse grid blocks within the distance $X_{val}$ away from the structure in any direction.

15. A method for drilling a wellbore in reservoir, the method comprising:
applying a coarse grid to a geologic formation of interest, the coarse grid having a plurality of coarse grid blocks;
identifying a structure of interest disposed in the geologic formation;
determining a fine grid zone around the structure based upon a time period for flow simulation of the geologic formation and a an average permeability and an average porosity of the geologic formation in a local region adjacent the structure;

applying a fine grid to the coarse grid blocks encompassed by the fine grid zone to determine flow adjacent the structure;

based on the determined flow, selecting a position and trajectory for a wellbore in the formation;

preparing equipment to construct a portion of said wellbore; and drilling a wellbore in accordance with the selected trajectory, wherein determining the fine grid zone includes calculating a distance $X_{val}$ away from the structure at which the fine grid zone terminates, the calculating based upon the time period for flow simulation and the average permeability and the average porosity of the geologic formation in the local region adjacent the structure, and wherein the calculating the distance $X_{val}$ is in accordance with the equation:

$$X_{val} = 10^a * \sqrt{\frac{time * k}{por}},$$

wherein time=the time period for simulation, k=average permeability for the local region adjacent the structure, por=average porosity of the local region adjacent the structure, and a=an empirical constant determined through calibration simulation of a linear subset of the geologic formation.

16. The method of claim 15, wherein the fine grid zone is defined by the coarse grid blocks within the distance $X_{val}$ in a direction away from the structure.

* * * * *